(12) United States Patent
Hirosawa

(10) Patent No.: US 9,586,331 B2
(45) Date of Patent: Mar. 7, 2017

(54) DISK-SHAPED WORKPIECE DIVIDING METHOD

(71) Applicant: DISCO CORPORATION, Tokyo (JP)

(72) Inventor: Shunichiro Hirosawa, Tokyo (JP)

(73) Assignee: Disco Corporation, Tokyo (JP)

( * ) Notice: Subject to any disclaimer, the term of this patent is extended or adjusted under 35 U.S.C. 154(b) by 63 days.

(21) Appl. No.: 14/215,368

(22) Filed: Mar. 17, 2014

(65) Prior Publication Data
US 2014/0298968 A1 Oct. 9, 2014

(30) Foreign Application Priority Data

Apr. 8, 2013 (JP) .................................. 2013-080097

(51) Int. Cl.
| | |
|---|---|
| B26D 1/04 | (2006.01) |
| H01L 21/78 | (2006.01) |
| B28D 5/02 | (2006.01) |
| H01L 21/67 | (2006.01) |

(52) U.S. Cl.
CPC .............. B26D 1/04 (2013.01); B28D 5/022 (2013.01); H01L 21/67092 (2013.01); H01L 21/78 (2013.01); Y10T 83/0524 (2015.04)

(58) Field of Classification Search
CPC .............. B81C 1/0865; B81C 1/00865; B81C 1/00873; B81C 1/0088; B81C 1/00888; B81C 1/00896; B81C 1/00904; H01L 21/78; H01L 21/7806; H01L 21/784; H01L 21/786; B26D 1/04; B26D 5/022
USPC ............ 438/113, 460; 83/929.1, 42, 43, 267
See application file for complete search history.

(56) References Cited

U.S. PATENT DOCUMENTS

| | | | | |
|---|---|---|---|---|
| 7,129,150 B2* | 10/2006 | Kawai | ................ | B23K 26/0057 |
| | | | | 257/E21.599 |
| 8,415,233 B2* | 4/2013 | Lake | ..................... | B28D 5/022 |
| | | | | 438/462 |
| 2005/0070074 A1* | 3/2005 | Priewasser | .............. | B24B 7/228 |
| | | | | 438/462 |
| 2005/0090076 A1* | 4/2005 | Barsky | ................ | H01L 21/6836 |
| | | | | 438/464 |
| 2009/0081828 A1* | 3/2009 | Freidhoff | ............ | B81C 1/00888 |
| | | | | 438/113 |
| 2009/0170288 A1* | 7/2009 | Ito | .......................... | H01L 21/78 |
| | | | | 438/462 |

(Continued)

FOREIGN PATENT DOCUMENTS

JP       2013-021109        1/2013

*Primary Examiner* — Stephen Choi
*Assistant Examiner* — Fernando Ayala
(74) *Attorney, Agent, or Firm* — Greer Burns & Crain Ltd.

(57) ABSTRACT

A dividing method for a disk-shaped workpiece having a plurality of first division lines and a plurality of second division lines intersecting the first division lines. The workpiece is cut along the first and second division lines by using a cutting blade in a down cut manner as supplying a cutting fluid to the cutting blade, wherein the workpiece is fully cut in a thickness direction thereof to obtain a plurality of chips. The dividing method includes a first cutting step of cutting the workpiece along the first division lines and a second cutting step of cutting the workpiece along the second division lines. In at least the second cutting step, the outer circumference of the workpiece at the cut end of each second division line is not cut to form an uncut region, thereby suppressing the formation of waste chips.

3 Claims, 13 Drawing Sheets

(56) References Cited

U.S. PATENT DOCUMENTS

| | | | |
|---|---|---|---|
| 2009/0314144 A1* | 12/2009 | Iri | B28D 5/0064 83/13 |
| 2013/0203237 A1* | 8/2013 | Yamaguchi | H01L 21/306 438/460 |
| 2014/0206177 A1* | 7/2014 | Ogawa | H01L 21/78 438/462 |
| 2015/0093882 A1* | 4/2015 | Arai | H01L 21/6835 438/462 |

* cited by examiner

DISK-SHAPED WORKPIECE DIVIDING METHOD

BACKGROUND OF THE INVENTION

Field of the Invention

The present invention relates to a disk-shaped workpiece dividing method of cutting a disk-shaped workpiece such as a wafer along a plurality of crossing division lines by using a cutting blade to thereby divide the workpiece into individual chips.

Description of the Related Art

In the field of precision parts manufacture, there is a case that a disk-shaped workpiece such as a semiconductor wafer, optical device wafer, glass substrate, and ceramic substrate is divided into a plurality of rectangular chips as a workpiece. In dividing such a workpiece, one side of the workpiece is usually attached to a dicing tape, and a cutting blade is rotated to cut into the workpiece from the other side thereof to the dicing tape. In this condition, the cutting blade being rotated is relatively moved along a division line to fully cut the workpiece over the thickness thereof.

In relatively moving the cutting blade being rotated along the division line, so-called down cut is generally performed in such a manner that the front edge of the cutting blade in the feeding direction thereof cuts into the workpiece from the upper surface toward the lower surface thereof. This is due to the fact that the size of chipping in cutting the workpiece can be suppressed as compared with so-called up cut such that the cutting blade is rotated to cut into the workpiece from the lower surface toward the upper surface thereof. Further, a cutting fluid is supplied to the workpiece, so as to reduce the processing heat generated from the cutting blade during cutting.

In cutting the workpiece along a plurality of crossing division lines set on the workpiece to divide the workpiece into rectangular chips, a plurality of triangular or trapezoidal waste chips are produced near the outer circumference of the workpiece. Each waste chip is smaller in area than each rectangular chip obtained by dividing the workpiece. In the case of a semiconductor wafer and an optical device wafer, the outer circumference of the workpiece is chamfered to form an arc as viewed in a thickness direction of the workpiece, so that an adhesive force of each waste chip to the dicing tape is weak. For these reasons, there is a possibility of chip scattering such that the waste chips may be separated to scatter from the dicing tape during cutting.

On the other hand, the cutting fluid supplied to the cutting blade sticks to the cutting blade and rotates therewith. Accordingly, in the case of the down cut mentioned above, the cutting fluid flows on the workpiece from the front side toward the back side in the feeding direction of the cutting blade. The chip scattering of waste chips mentioned above is increased in risk of occurrence by a phenomenon such that the cutting fluid rotating with the cutting blade may collide with the waste chips. In particular, when the waste chips are formed on the front side in the feeding direction to cause the chip scattering, the waste chips scatter toward the back side in the feeding direction with the flow of the cutting fluid and then fall onto the upper surface of the workpiece. As a result, there arises a problem such that the upper surface of the workpiece may be scratched by the waste chips. To cope with this problem, there has been proposed a dicing tape having a configuration such that an annular portion corresponding to the outer peripheral portion of the workpiece has a large adhesive strength to reduce the chip scattering of the waste chips (Japanese Patent Laid-open No. 2013-21109).

SUMMARY OF THE INVENTION

However, the dicing tape proposed in Japanese Patent Laid-open No. 2013-21109 mentioned above has a special configuration, causing an increase in cost. Further, in attaching the workpiece to this dicing tape, the outer peripheral portion of the workpiece must be aligned with the annular portion of the dicing tape increased in adhesive strength, causing an increase in number of man-hours.

It is therefore an object of the present invention to provide a disk-shaped workpiece dividing method which can prevent the possibility that the upper surface of the workpiece may be scratched by the chip scattering, without an increase in cost and number of man-hours.

In accordance with an aspect of the present invention, there is provided a dividing method for a disk-shaped workpiece on which a plurality of first division lines extending in a first direction and a plurality of second division lines intersecting the first direction extending in a second direction are set to define a plurality of chips, the disk-shaped workpiece having a chip region where the chips are formed and a peripheral marginal region surrounding the chip region, the dividing method including a first cutting step of fully cutting the workpiece in a thickness direction thereof along the first division lines by using a cutting blade; and a second cutting step of fully cutting the workpiece in the thickness direction along the second division lines by using the cutting blade after performing the first cutting step, wherein the direction of rotation of the cutting blade is set so that the cutting blade cuts the workpiece from the upper surface to the lower surface thereof, and a cutting fluid is supplied to the cutting blade in performing the first cutting step and the second cutting step, and in at least the second cutting step, the cutting blade is fed to cut into the workpiece from the outside of an outer circumference thereof in the second direction toward a cut end where the outer circumference of the workpiece is not cut to form an uncut region.

According to the present invention, the outer circumference of the workpiece at the cut end of each second division line in the second direction is not cut to form an uncut region in performing at least the second cutting step, thereby suppressing the formation of waste chips along the outer circumference of the workpiece. Accordingly, it is possible to suppress chip scattering such that the waste chips may scatter toward the back side in the feeding direction of the cutting blade with the flow of the cutting fluid. As a result, it is possible to prevent the possibility that the upper surface of the workpiece may be scratched by the chip scattering.

Preferably, the first cutting step includes a first step of feeding the cutting blade to cut into the workpiece from one end in the first direction toward the other end in the first direction for the substantially half number of the first division lines counted from one end in the second direction to the substantially central position of the workpiece, thereby forming division grooves along the first division lines in the condition where the outer circumference of the workpiece near the other end in the first direction is not cut to form a first uncut region; and a second step of feeding the cutting blade to cut into the workpiece from the other end in the first direction toward one end in the first direction for the remaining half number of the first division lines counted from the other end in the second direction to the substantially central position of the workpiece, thereby forming division grooves along the first division lines in the condition where the outer circumference of the workpiece near one end in the first direction is not cut to form a second uncut region; and the second cutting step includes a third step of feeding the cutting blade to cut into the workpiece from one end in the second direction toward the other end in the second direction for the substantially half number of the second division lines counted from one end in the first direction to the substantially central position of the workpiece, thereby forming division grooves along the second division lines in the condition where the outer circumference of the workpiece near the other end in the second direction is not cut to form a third uncut region; and a fourth step of feeding the cutting blade to cut into the workpiece from the other end in the second direction toward one end in the second direction for the remaining half number of the second division lines counted from the other end in the first direction to the substantially central position of the workpiece, thereby forming division grooves along the second division lines in the condition where the outer circumference of the workpiece near one end in the second direction is not cut to form a fourth uncut region.

In this mode, the uncut regions are formed in both the first cutting step and the second cutting step. Accordingly, the chip scattering can be further suppressed to thereby further prevent the possibility that the upper surface of the workpiece may be scratched by the chip scattering.

Concerning "the substantially central position" of the workpiece and "the substantially half number" of the division line (the first or second division line) counted from one end or the other end, the following definition is made. Basically, "the substantially half number" of the division lines counted from one end or the other end to the substantially central position of the workpiece means the just half number of all the division lines lying in the range from one end to the other end. Further, in the case that the number of the division lines is an odd number, either the number of the division lines counted from one end to the substantially central position of the workpiece or the number of the division lines counted from the other end to the substantially central position of the workpiece is larger by one. Further, in the case that the number of the division lines is an even number and one of the division lines passes through the center of the workpiece, either the number of the division lines counted from one end to the substantially central position of the workpiece or the number of the division lines counted from the other end to the substantially central position of the workpiece is larger by one. On the other hand, "the substantially central position" of the workpiece basically means a region where the number of the division lines counted from one end is equal to the number of the division lines counted from the other end. Further, "the substantially central position" of the workpiece also means a region where either the number of the division lines counted from one end or the number of the division lines counted from the other end is larger by one as mentioned above.

In the present invention, the second cutting step includes a first division groove forming step of feeding the cutting blade to cut into the workpiece from one end in the second direction along the second division lines to a central position of the workpiece, thereby forming first division grooves along the second division lines; and a second division groove forming step of feeding the cutting blade to cut into the workpiece from the other end in the second direction along the second division lines to the central position of the workpiece, thereby forming second division grooves respectively connected with the first division grooves along the second division lines.

In this mode, the cutting blade is fed to cut into the workpiece from one end and the other end in the second direction to the central position of the workpiece in performing the second cutting step. Accordingly, waste chips are formed at the time the cutting blade starts cutting the workpiece at one end and the other end in the second direction, and the cutting blade is fed to the central position of the workpiece. Accordingly, even when chip scattering occurs due to the flow of the cutting fluid in forming the waste chips, the waste chips scatter to the outside of the workpiece and there is no possibility that the waste chips may fall onto the upper surface of the workpiece. As a result, it is possible to prevent the scratch on the upper surface of the workpiece due to the chip scattering.

According to the present invention, it is possible to provide a disk-shaped workpiece dividing method which can prevent the possibility that the upper surface of the workpiece may be scratched by the chip scattering, without an increase in cost and number of man-hours.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
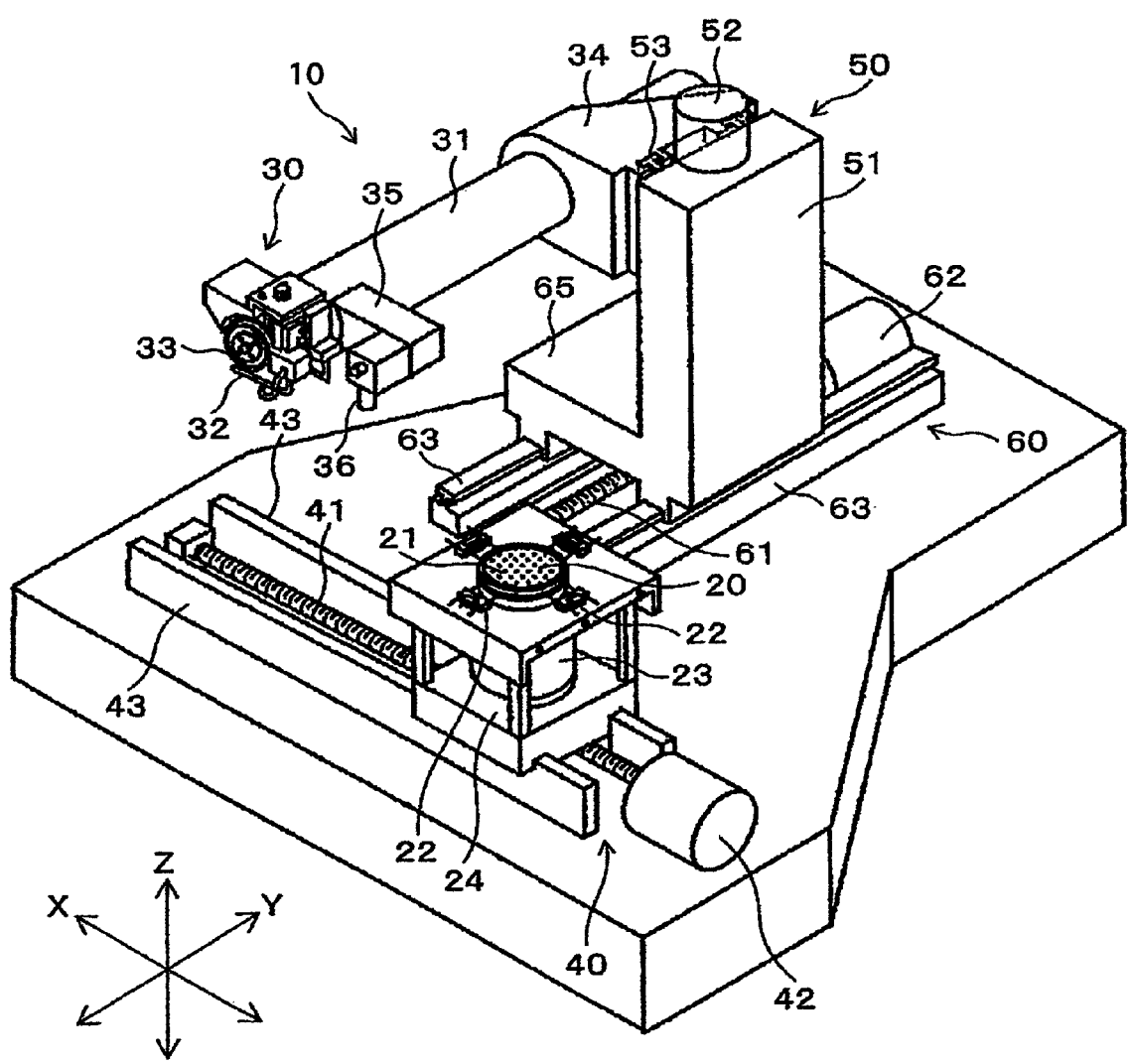
FIG. 1 is a perspective view of a cutting apparatus capable of performing the dividing method according to a embodiment of the present invention.

Some preferred embodiments of the present invention will now be described with reference to the drawings. FIG. 1 shows a cutting apparatus 10 capable of preferably performing the dividing method according to the preferred embodiment, and reference symbol 1 in FIG. 2 denotes a disk-shaped workpiece to be cut by the cutting apparatus 2.

(1) Workpiece

Figure 2:
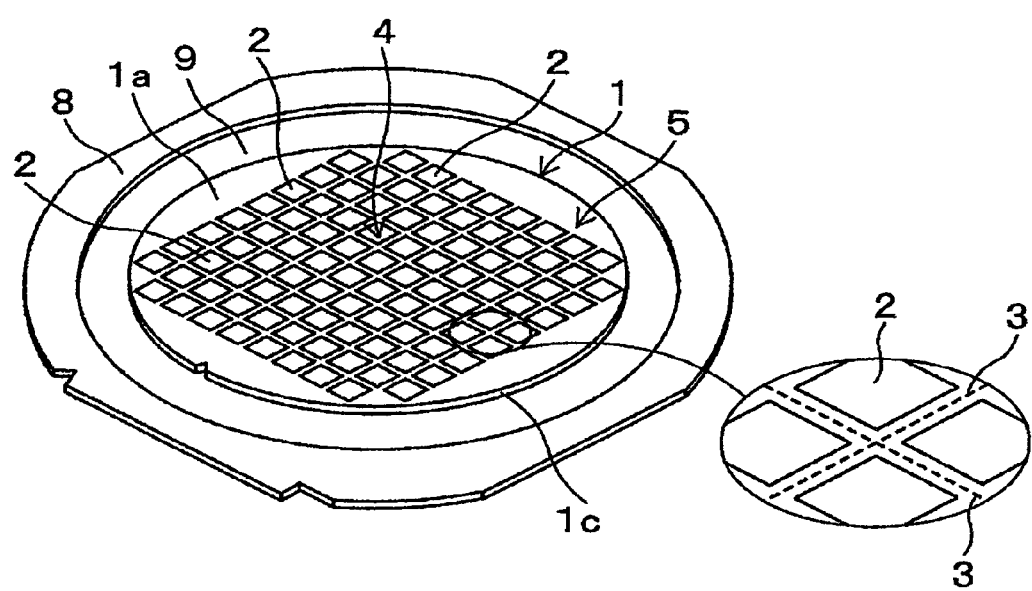
FIG. 2 is a perspective view of a disk-shaped workpiece to be divided by the cutting apparatus in the condition where the workpiece is supported through a dicing tape to an annular frame.
Figure 3:
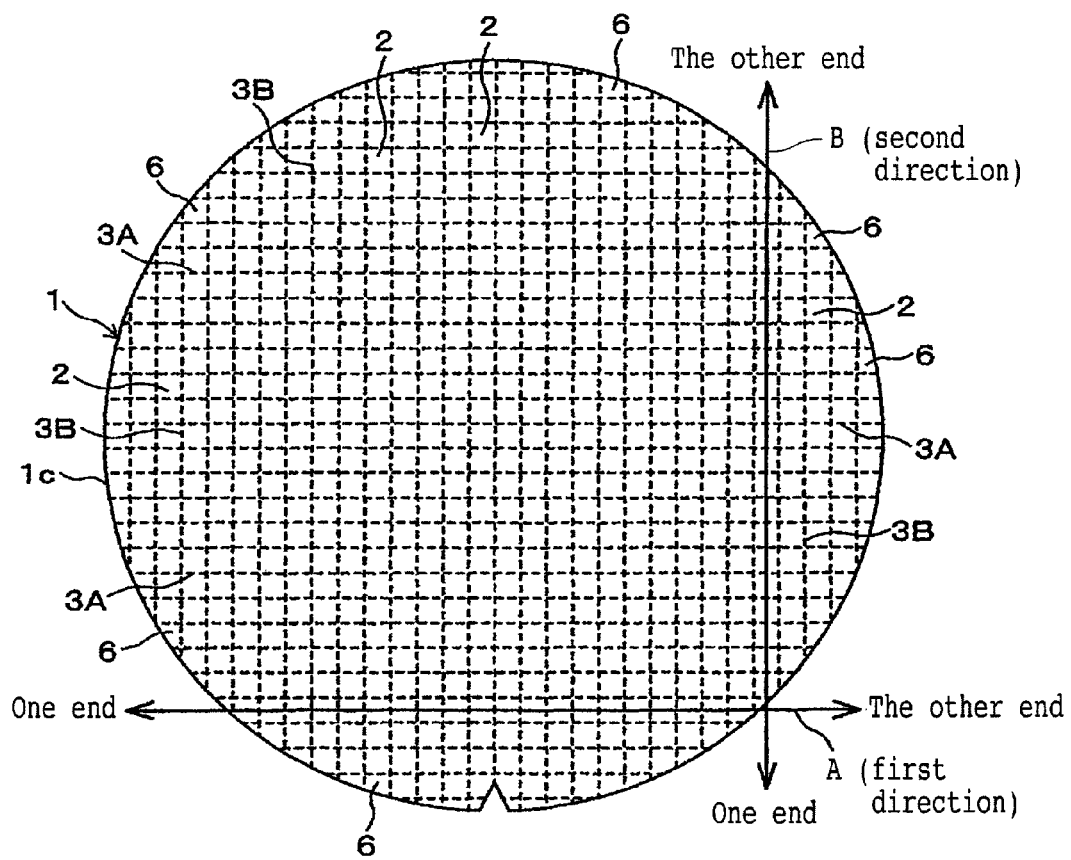
FIG. 3 is a plan view of the workpiece held on a holding table included in the cutting apparatus, showing a first direction and a second direction extenging along crossing division lines set on the workpiece.

The workpiece 1 shown in FIG. 2 is a semiconductor wafer having a thickness of tens to hundreds of micrometers, for example. A plurality of rectangular devices 2 are provided on a front side 1a of the workpiece 1. A plurality of crossing division lines 3 composed of first division lines and second division lines perpendicular to the first division lines are set on the front side 1a of the workpiece 1 to thereby define a plurality of separate rectangular regions, in which a plurality of electronic circuits such as ICs and LSIs are respectively formed, thus separately providing the plural devices 2. As described later, the workpiece 1 is divided along the division lines 3 to thereby obtain individual chips respectively having the plural devices 2. While the pitch of the division lines 3 is actually fine as shown in FIG. 3, it is schematically shown in FIG. 2 for convenience of illustration.

The workpiece 1 has a chip region 4 occupying a large proportion where the plural devices 2 are formed and a peripheral marginal region 5 surrounding the chip region 4 so as to be formed along the outer circumference 1c of the workpiece 1. The peripheral marginal region 5 is a substantially annular region where the devices 2 are not formed. That is, the peripheral marginal region 5 is provided by a plurality of triangular or trapezoidal nonrectangular regions 6 (see FIG. 3) defined by the division lines 3 and the outer circumference 1c and continuously formed along the outer circumference 1c.

Prior to loading the workpiece 1 to the cutting apparatus 10, the workpiece 1 is attached to a dicing tape 9 supported to an annular frame 8 as shown in FIG. 2. The dicing tape 9 is composed of a base sheet and an adhesive layer formed on one side of the base sheet. The base sheet is formed of resin such as polyolefin and polyvinyl chloride. The adhesive layer is formed of acrylic adhesive or the like. The back side of the workpiece 1 is attached to the adhesive layer of the dicing tape 9. The frame 8 is formed from a rigid sheet of metal such as stainless steel. The frame 8 is attached to the dicing tape 9 so as to surround the workpiece 1. Thus, the workpiece 1 supported through the dicing tape 9 to the frame 8 is handled through the frame 8 and loaded to the cutting apparatus 10. The configuration of the cutting apparatus 10 will now be described.

(2) Cutting Apparatus

The cutting apparatus 10 shown in FIG. 1 includes a holding table 20 for horizontally holding the workpiece 1 and cutting means 30 for cutting the workpiece 1 held on the holding table 20. The holding table 20 has a circular holding surface 21 having a size capable of mounting the workpiece 1 thereon. The holding surface 21 is formed of a porous material, and the workpiece 1 is adapted to be held on the holding surface 21 under suction provided by a vacuum source (not shown). A plurality of clamps 22 for nippingly holding the frame 8 is provided on the outer circumferential surface of the holding table 20. The holding table 20 is rotatable by a rotating mechanism 23. The rotating mechanism 23 is fixed to an X-axis moving base 24. The X-axis moving base 24 is movable in the X direction by X-axis feeding means 40.

The X-axis feeding means 40 is composed of a screw rod 41 extending in the X direction, a pulse motor 42 connected to one end of the screw rod 41, and a pair of guide rails 43 extending parallel to the screw rod 41. A nut (not shown) provided in a lower portion of the X-axis moving base 24 is threadedly engaged with the screw rod 41. The screw rod 41 is driven by the pulse motor 42 to rotate in opposite directions. With the rotation of the screw rod 41 by the pulse motor 42, the X-axis moving base 24 is moved in the X direction along the guide rails 43.

The cutting means 30 includes a supporting portion 34, a cylindrical spindle housing 31 supported to the supporting portion 34, a spindle (not shown) rotatably provided in the spindle housing 31 so as to extend in the Y direction, and a cutting blade 33 mounted on the front end of the spindle. A cutting fluid nozzle 32 for supplying a cutting fluid to the cutting blade 33 is provided on the front end of the spindle housing 31. Further, imaging means 35 having a microscope camera 36 for imaging the workpiece 1 is fixed to the cylindrical surface of the spindle housing 31 near the front end thereof.

The cutting means 30 and the imaging means 35 are integrally provided and movable together in the Z direction by Z-axis feeding means 50. The Z-axis feeding means 50 is composed of a screw rod (not shown) supported to a wall portion 51 so as to extend in the Z direction, a pulse motor 52 for rotationally driving the screw rod, and a pair of guide rails 53 extending parallel to the screw rod. A nut (not shown) provided in the supporting portion 34 is threadedly engaged with the screw rod. With the rotation of the screw rod by the pulse motor 52, the supporting portion 34 is moved in the Z direction along the guide rails 53. Accordingly, the cutting means 30 supported to the supporting portion 34 is also moved in the Z direction together with the supporting portion 34.

The cutting means 30 is movable in the Y direction by Y-axis feeding means 60. The Y-axis feeding means 60 is composed of a screw rod 61 extending in the Y direction, a Y-axis moving base 65 formed integrally with the wall portion 51 and provided with a nut (not shown) threadedly engaged with the screw rod 61, a pulse motor 62 for rotating the screw rod 61, and a pair of guide rails 63 extending parallel to the screw rod 61. With the rotation of the screw rod 61 by the pulse motor 62, the Y-axis moving base 65 is moved in the Y direction along the guide rails 63. Accordingly, the cutting means 30 is also moved in the Y direction together with the Y-axis moving base 65.

In cutting the workpiece 1 by using the cutting apparatus 10 mentioned above, the workpiece 1 is held through the dicing tape 9 on the holding surface 21 of the holding table 20 under suction in the condition where the front side 1a of the workpiece 1 is exposed. Further, the frame 8 is held by the clamps 22. Thereafter, the front side 1a of the workpiece 1 is imaged by the imaging means 35 to detect the positions of the division lines 3. Thereafter, the holding table 20 is rotated according to the detected positions of the division lines 3 to thereby make the division lines 3 extending in one direction parallel to the X direction. Further, the Y-axis moving base 65 is moved in the Y direction by the Y-axis feeding means 60 to align a predetermined one of these division lines 3 with the cutting blade 33 (indexing operation).

Thereafter, the cutting means 30 is lowered by the Z-axis feeding means 50 and the cutting blade 33 is rotated. Further, the holding table 20 is moved in the X direction by the X-axis feeding means 40 to thereby relatively move the cutting blade 33 in the X direction (feeding operation). Accordingly, the cutting blade 33 being rotated is fed to cut into the workpiece 1 from the outer circumference 1c along the predetermined division line 3. As a result, the workpiece 1 is cut along this predetermined division line 3 by the cutting blade 33.

Figure 4:
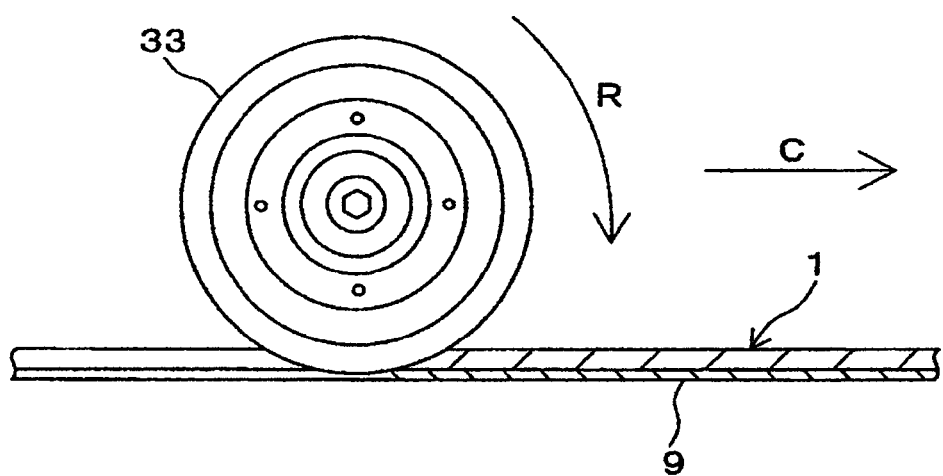
FIG. 4 is a side view for illustrating the down cut by a cutting blade included in the cutting apparatus.

As shown in FIG. 4, the rotational direction R of the cutting blade 33 in the feeding operation is set so that the front edge of the cutting blade 33 in the relative feeding direction C thereof cuts into the workpiece 1 from the upper surface toward the lower surface thereof (down cut). Further, the height of the cutting blade 33 is set to determine a depth of cut such that the cutting blade 33 cuts through the thickness of the workpiece 1 to reach the dicing tape 9. Accordingly, the workpiece 1 is fully cut along the predetermined division line 3, thereby forming a division groove. In performing the cutting operation by using the cutting blade 33, a cutting fluid is supplied from the cutting fluid nozzle 32 to the cutting blade 33.

The indexing operation and the feeding operation by the use of the cutting apparatus 10 are repeated for all of the other division lines 3 extending in one direction to form a plurality of division grooves along the division lines 3 extending in one direction. After forming the division grooves along the division lines 3 extending in one direction, the holding table 20 is rotated 90 degrees to make the division lines 3 which are not cut and extending in the other direction parallel to the X direction. Thereafter, the indexing operation and the feeding operation are similarly repeated for all of the division lines 3 extending in the other direction to form a plurality of division grooves along the division lines 3 extending in the other direction.

(3) Dividing Method

The preferred embodiments of the dividing method according to the present invention to be performed by using the cutting apparatus 2 will now be described. The following preferred embodiments relate to various formation patterns of the division grooves to be formed by using the cutting blade 33 to fully cut the workpiece 1 along the division lines 3. Accordingly, the operation of the cutting apparatus 2 in each preferred embodiment will not be described, but the formation patterns of the division grooves will be mainly described. In FIGS. 3 to 13, the relative feeding direction of the cutting blade 33 in the feeding operation is defined as a lateral direction.

(3-1) First Preferred Embodiment

FIG. 3 shows the workpiece 1 held on the holding table 20 of the cutting apparatus 2. In regard to the perpendicular division lines 3, the division lines 3 extending in a first direction A are set as first division lines 3A and the division lines 3 extending in a second direction B perpendicular to the first direction A are set as second division lines 3B.

Figure 5:
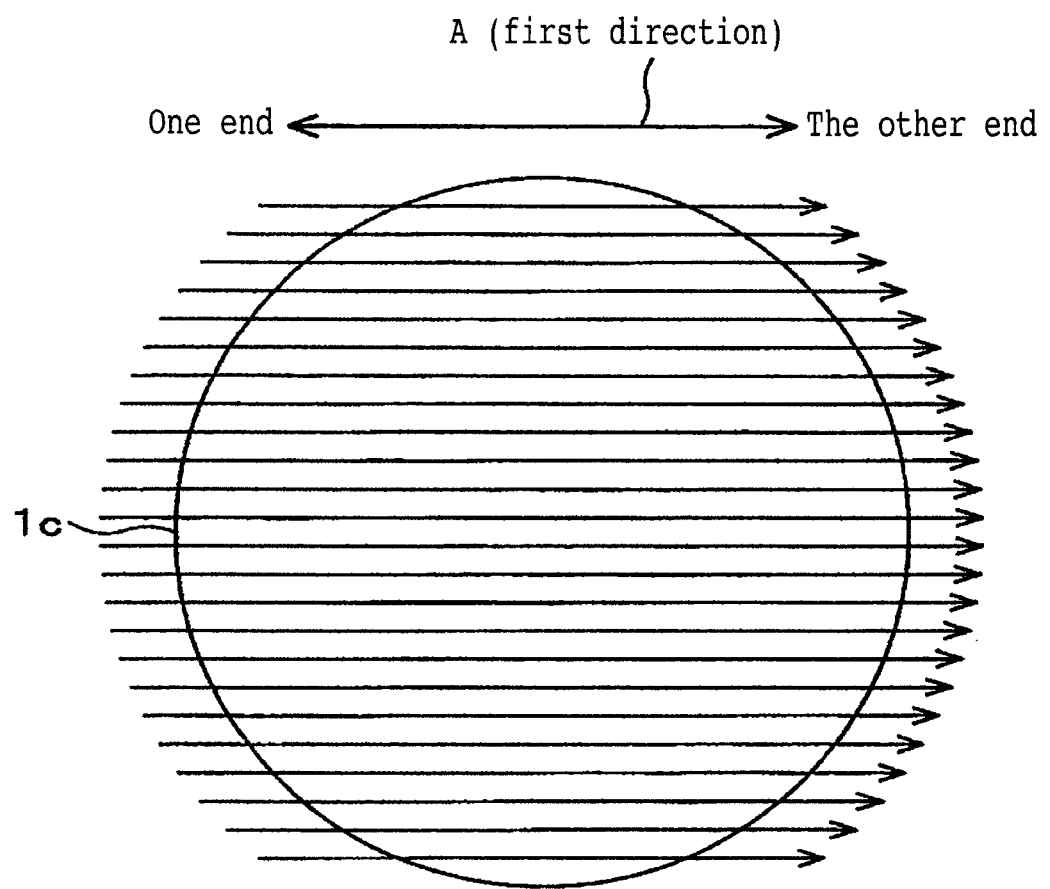
FIG. 5 is a plan view of the workpiece, showing a first cutting step according to a first preferred embodiment of the present invention.

First, the holding table 20 is rotated to make the first direction A parallel to the feeding direction (lateral direction as viewed in FIG. 5) as shown in FIG. 5. Thereafter, the cutting blade 33 is fed to cut into the workpiece 1 from one end (left end as viewed in FIG. 5) thereof along all of the first division lines 3A extending in the first direction A to the other end of the workpiece 1, wherein the workpiece 1 is fully cut in the direction along the thickness thereof, thereby forming the division grooves along the entire lengths of the first division lines 3A (first cutting step). In FIG. 5, the solid line arrows show the cutting lines of the cutting blade 33 in the first cutting step.

Figure 6:
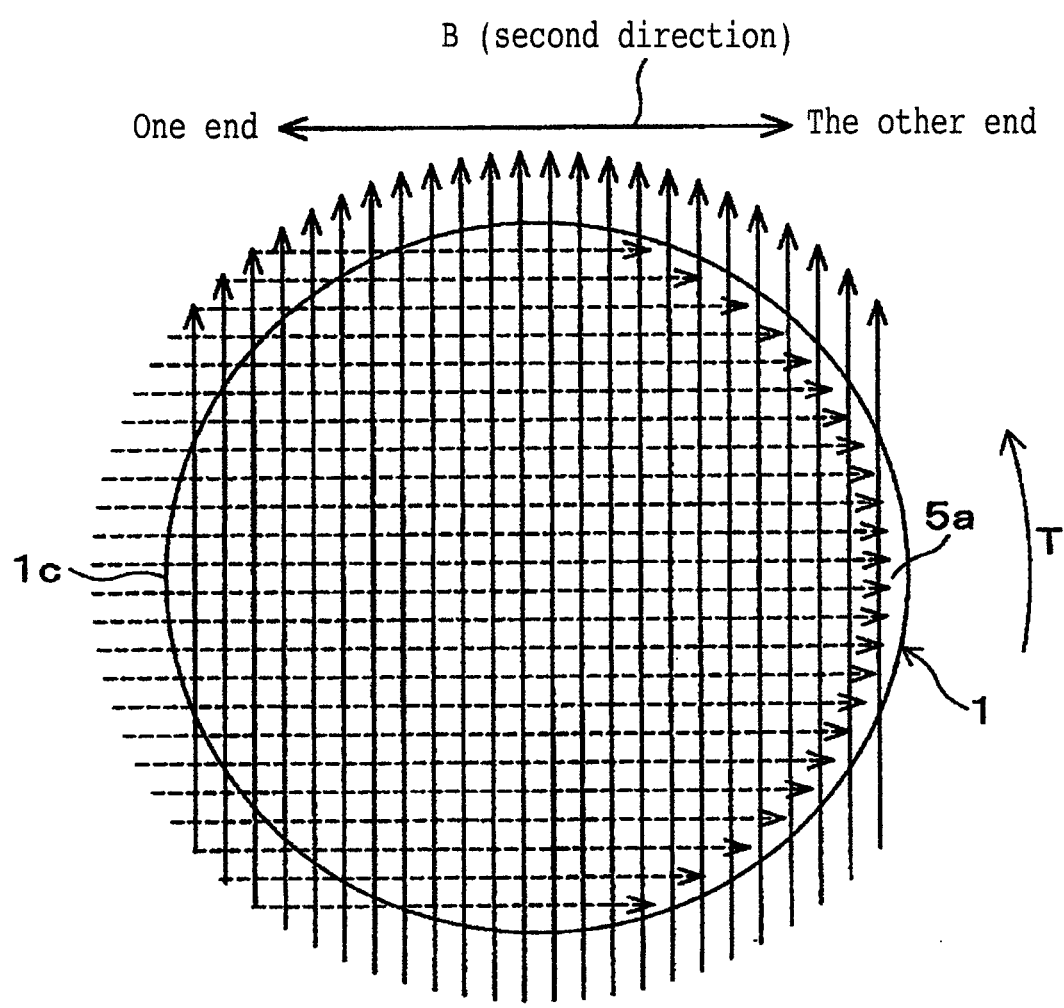
FIG. 6 is a plan view of the workpiece, showing a second cutting step according to the first preferred embodiment.
Figure 7:
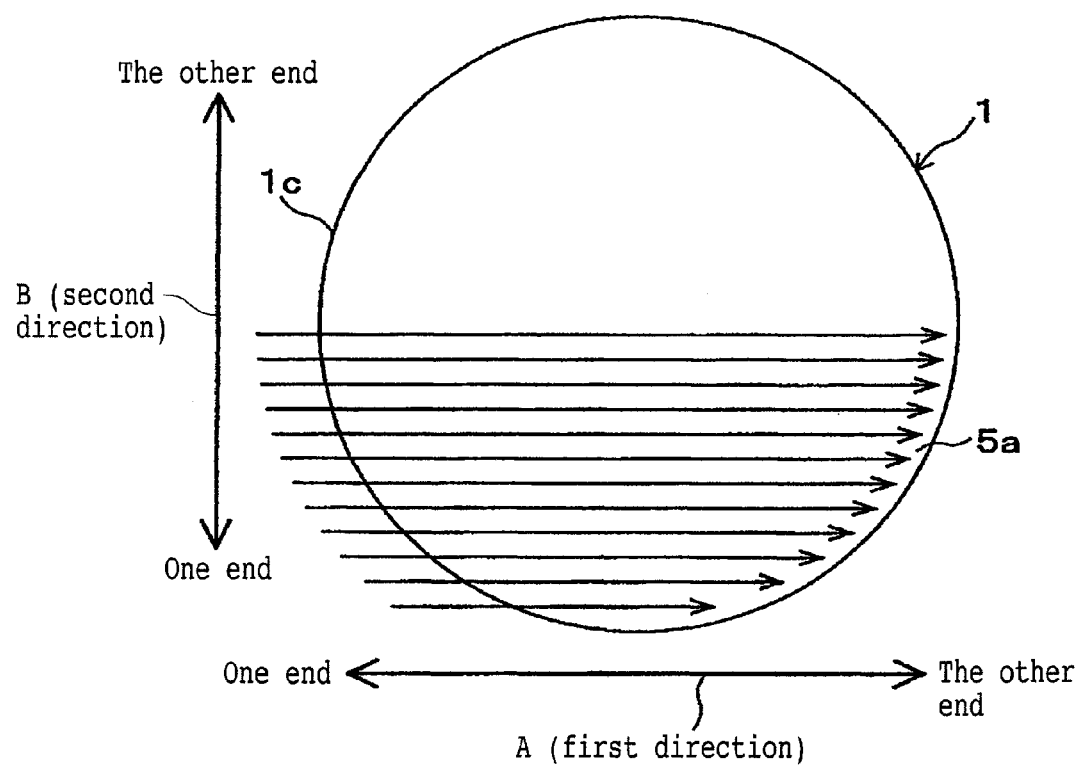
FIG. 7 is a plan view of the workpiece, showing a first step in a first cutting step according to a second preferred embodiment of the present invention.

Thereafter, the holding table 20 is rotated 90 degrees in the direction shown by an arrow T in FIG. 6 to make the second direction B parallel to the feeding direction. In this condition, the cutting blade 33 is fed to cut into the workpiece 1 from one end (left end as viewed in FIG. 6) thereof along all of the second division lines 3B extending in the second direction B toward the other end of the workpiece 1, wherein the workpiece 1 is fully cut in in the direction along the thickness thereof, thereby forming the division grooves along most of the entire lengths of the second division lines 3B. That is, the outer circumference 1c of the workpiece 1 near the other end (cut end or right end as viewed in FIG. 6) thereof is not cut by the cutting blade 33, but the cutting means 30 is retracted upward to stop the formation of the division grooves (second cutting step). In FIG. 6, the broken line arrows show the cutting lines of the cutting blade 33 in the second cutting step. Cutting by the cutting blade 33 is stopped near the other end of the workpiece 1 at a position where the cutting blade 33 has reached the boundary between the chip region 4 and the peripheral marginal region 5. By performing this cutting operation, the workpiece 1 is divided along the division lines 3A and 3B to obtain individual chips respectively corresponding to the rectangular devices 2. Further, the peripheral marginal region 5 near the other end of the workpiece 1 in the second direction B is left to form an uncut region 5a.

According to the first preferred embodiment mentioned above, the outer circumference 1c near the other end of the workpiece 1 in the second direction B is not cut in the second cutting step, but the uncut region 5a is formed. Accordingly, it is possible to suppress chip scattering such that the waste chips may scatter toward the back side (left side as viewed in FIG. 6) in the feeding direction of the cutting blade 33 with the flow of the cutting fluid. As a result, it is possible to prevent the possibility that the upper surface of the workpiece 1 may be scratched by the chip scattering.

(3-2) Second Preferred Embodiment

A second preferred embodiment of the present invention will now be described. As similar to the first preferred embodiment mentioned above, the second preferred embodiment basically includes a first cutting step of fully cutting all of the first division lines 3A in the direction along the thickness thereof to form the division grooves along the first division lines 3A and a second cutting step of fully cutting all of the second division lines 3B in the direction along the thickness thereof to form the division grooves along the second division lines 3B. However, the first cutting step and the second cutting step in the second preferred embodiment are different in configuration from those in the first preferred embodiment.

The first cutting step in the second preferred embodiment will now be described. For the substantially half number of the first division lines 3A counted from one end in the second direction B (lower end as viewed in FIG. 7) to the substantially central position of the workpiece 1, the cutting blade 33 is fed to cut into the workpiece 1 from one end in the first direction A (left end as viewed in FIG. 7) along the first division lines 3A toward the other end in the first direction A (cut end or right end as viewed in FIG. 7) as shown by the solid line arrows in FIG. 7, thereby forming the division grooves along the first division lines 3A in the condition where the outer circumference 1c of the workpiece 1 near the other end in the first direction A is not cut to form an uncut region 5*a* (first step). The formation of the uncut region 5*a* near the other end in the first direction is similar to that in the second cutting step in the first preferred embodiment. That is, cutting by the cutting blade 33 is stopped near the other end in the first direction A at a position where the cutting blade 33 has reached the boundary between the chip region 4 and the peripheral marginal region 5.

Figure 8:
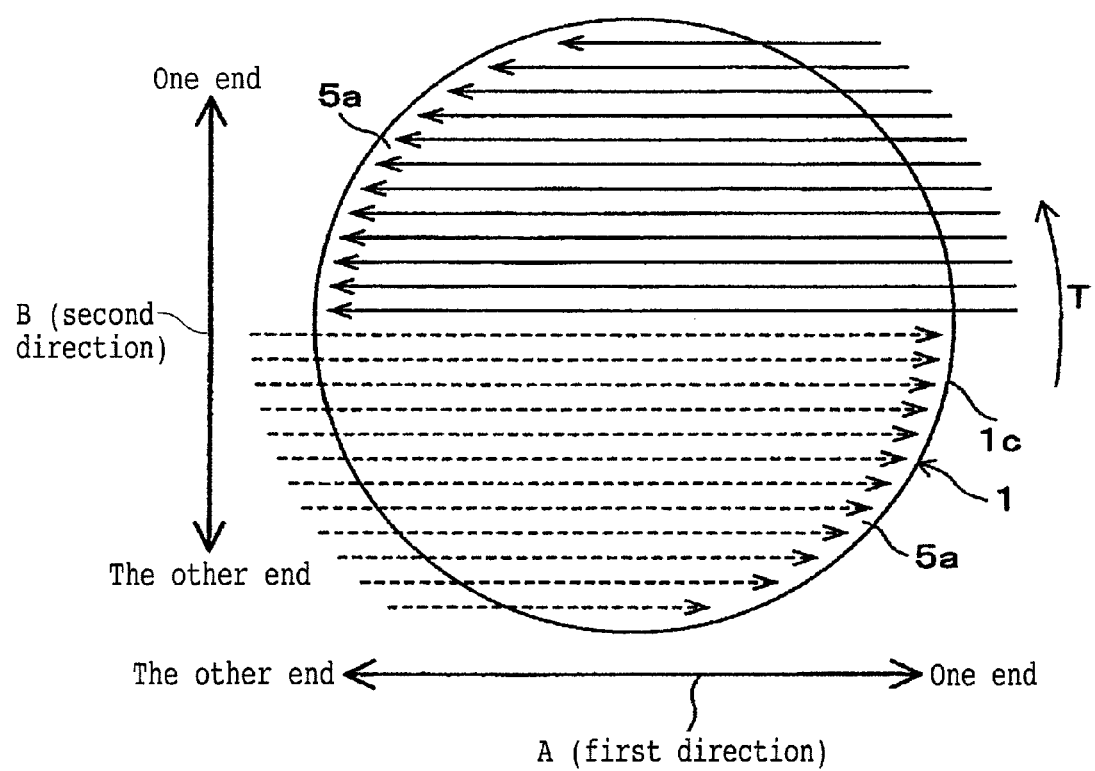
FIG. 8 is a plan view of the workpiece, showing a second step in the first cutting step according to the second preferred embodiment.

Thereafter, the holding table 20 is rotated 180 degrees in the direction shown by an arrow T in FIG. 8 to change the other end in the first direction A to the left end as viewed in FIG. 8 and make the first direction A parallel to the feeding direction. In this condition, the cutting operation is similarly performed by the remaining half number of the first division lines 3A counted from the other end in the second direction B (lower end as viewed in FIG. 8) to the substantially central position of the workpiece 1 as shown by the broken line arrows in FIG. 8. That is, the cutting blade 33 is fed to cut into the workpiece 1 from the other end in the first direction A (left end as viewed in FIG. 8) along the first division lines 3A toward one end in the first direction A (cut end or right end as viewed in FIG. 8), thereby forming the division grooves along the first division lines 3A in the condition where the outer circumference 1*c* of the workpiece 1 near one end in the first direction A is not cut to form an uncut region 5*a* (second step).

Thus, the first cutting step is finished to form the division grooves along all of the first division lines 3A on the workpiece 1. Thereafter, the second cutting step is performed in the following manner to form the division grooves along all of the second division lines 3B on the workpiece 1.

Figure 9:
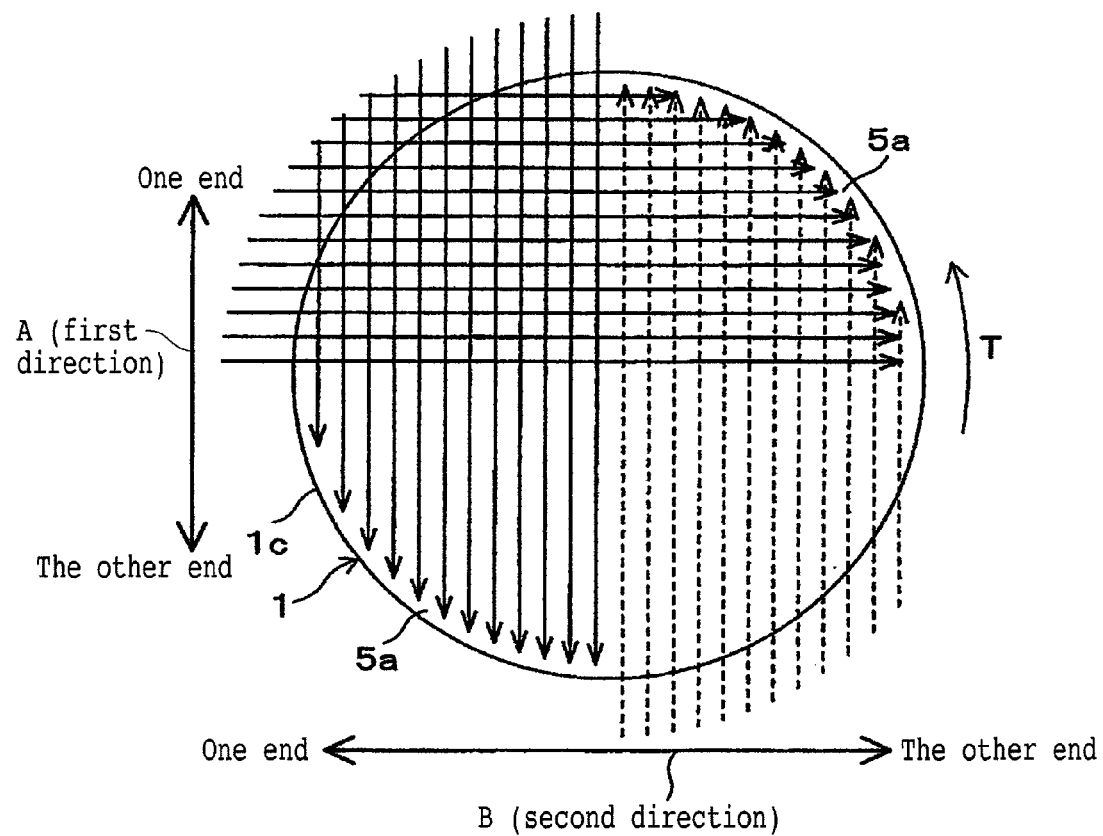
FIG. 9 is a plan view of the workpiece, showing a third step in a second cutting step according to the second preferred embodiment.

As shown in FIG. 9, the holding table 20 is rotated 90 degrees in the direction shown by an arrow T from the condition shown in FIG. 8 to change one end in the second direction B to the left end as viewed in FIG. 9 and make the second direction B parallel to the feeding direction. In this condition, the cutting operation is similarly performed for the substantially half number of the second division lines 3B counted from one end in the first direction A (upper end as viewed in FIG. 9) to the substantially central position of the workpiece 1 as shown by the solid line arrows extending in the feeding direction in FIG. 9. That is, the cutting blade 33 is fed to cut into the workpiece 1 from one end in the second direction B (left end as viewed in FIG. 9) along the second division lines 3B toward the other end in the second direction B (cut end or right end as viewed in FIG. 9), thereby forming the division grooves along the second division lines 3B in the condition where the outer circumference 1*c* of the workpiece 1 near the other end in the second direction B is not cut to leave the uncut region 5*a* formed in the second step of the first cutting step (third step).

Figure 10:
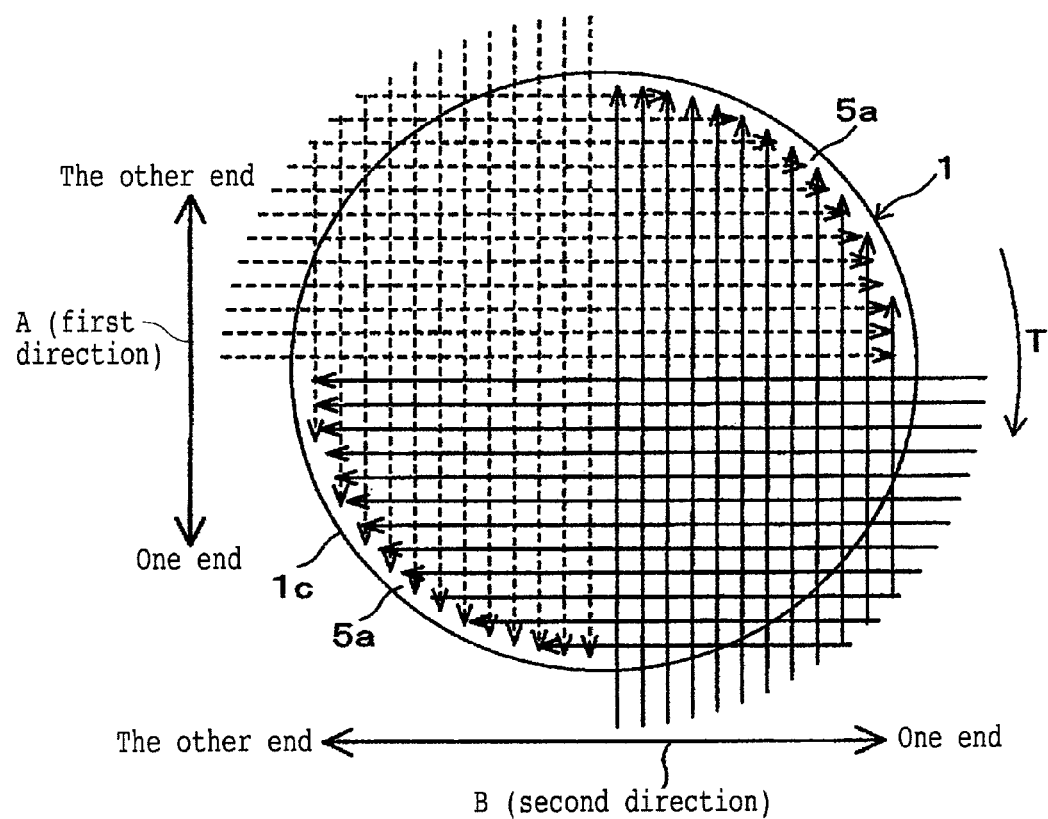
FIG. 10 is a plan view of the workpiece, showing a fourth step in the second cutting step according to the second preferred embodiment.

Thereafter, as shown in FIG. 10, the holding table 20 is rotated 180 degrees in the direction shown by an arrow T from the condition shown in FIG. 9 to change the other end in the second direction B to the left end as viewed in FIG. 10 and make the second direction B parallel to the feeding direction. In this condition, the cutting operation is similarly performed for the remaining half number of the second division lines 3B counted from the other end in the first direction A (upper end as viewed in FIG. 10) to the substantially central position of the workpiece 1 as shown by the broken line arrows extending in the feeding direction in FIG. 10. That is, the cutting blade 33 is fed to cut into the workpiece 1 from the other end in the second direction B (left end as viewed in FIG. 10) along the second division lines 3B toward one end in the second direction B (cut end or right end as viewed in FIG. 10), thereby forming the division grooves along the second division lines 3B in the condition where the outer circumference 1*c* of the workpiece 1 near one end in the second direction B is not cut to leave the uncut region 5*a* formed in the first step of the first cutting step (fourth step). Thusly, the second cutting step is finished to form the division grooves along all of the second division lines 3B on the workpiece 1. As a result, all of the rectangular devices 2 are divided into individual chips.

According to the second preferred embodiment, the uncut regions 5*a* are formed in both the first cutting step and the second cutting step. Accordingly, the chip scattering can be further suppressed to thereby further prevent the possibility that the upper surface of the workpiece 1 may be scratched by the chip scattering.

(3-3) Third Preferred Embodiment

Figure 11:
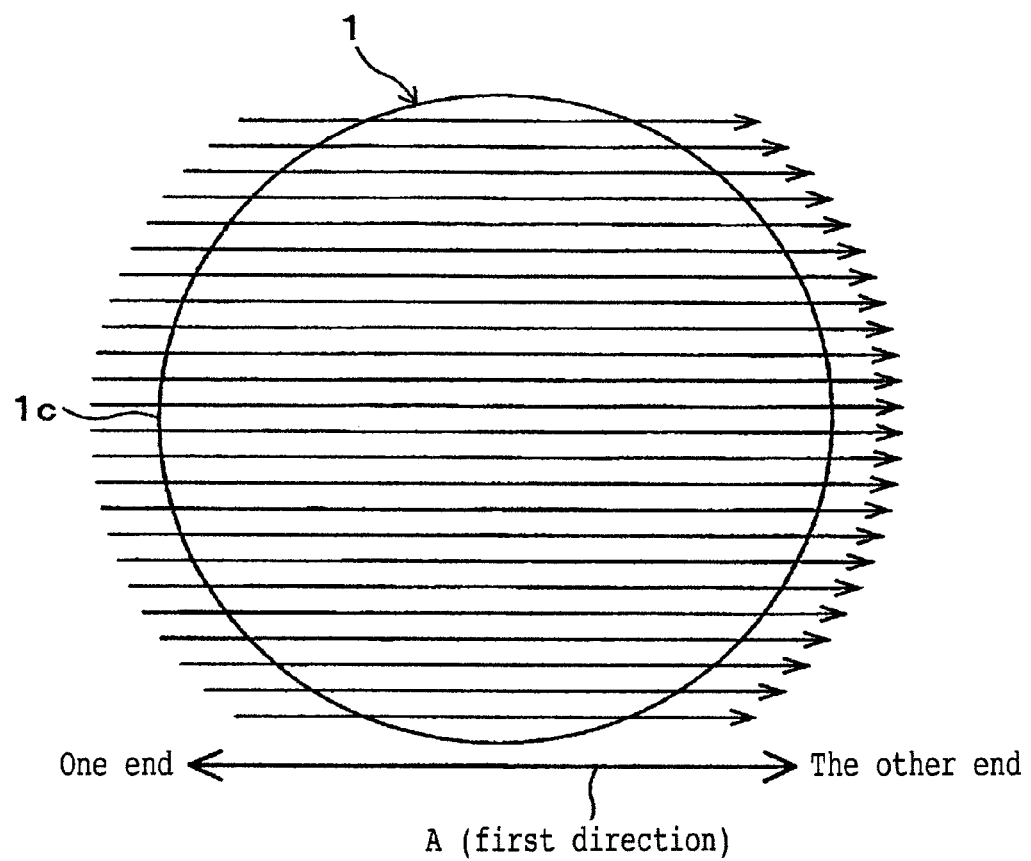
FIG. 11 is a plan view of the workpiece, showing a first cutting step according to a third preferred embodiment of the present invention.

A third preferred embodiment of the present invention will now be described. In the third preferred embodiment, a first cutting step is similar to that in the first preferred embodiment, but a second cutting step is different in configuration from that in the first preferred embodiment. As shown in FIG. 11, for all of the first division lines 3A extending in the first direction A parallel to the feeding direction, the cutting blade 33 is fed to cut into the workpiece 1 from one end in the first direction A (left end as viewed in FIG. 11) along the first division lines 3A to the other end in the first direction A as shown by the solid line arrows in FIG. 11, thereby forming the division grooves along the entire lengths of the first division lines 3A, wherein the workpiece 1 is fully cut in the direction along the thickness thereof (first cutting step).

Figure 12:
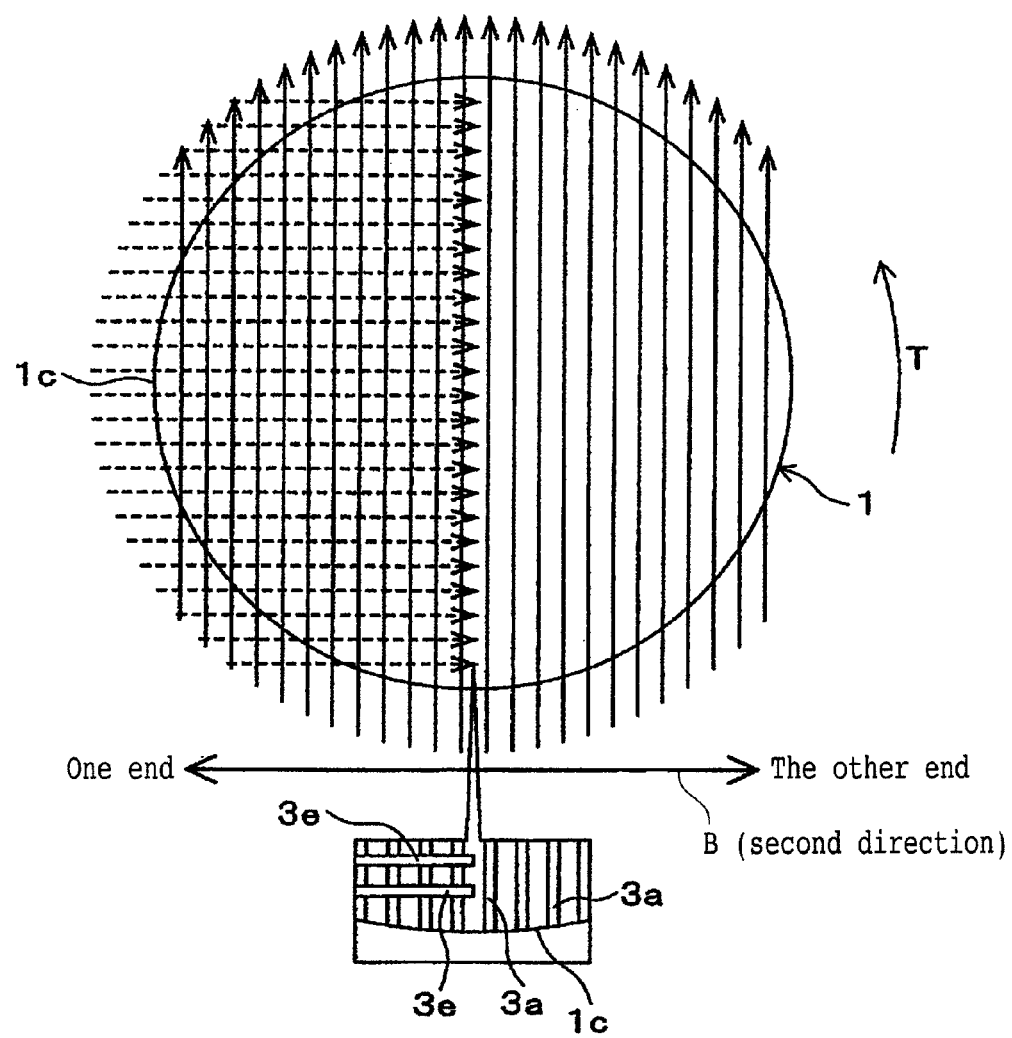
FIG. 12 is a plan view of the workpiece, showing a first division groove forming step in a second cutting step according to the third preferred embodiment.

Thereafter, the second cutting step of fully cutting the workpiece 1 along the second division lines 3B is performed in the following manner. As shown in FIG. 12, the holding table 20 is rotated 90 degrees in the direction shown by an arrow T from the condition shown in FIG. 11 to make the second direction B parallel to the feeding direction. In this condition, the cutting blade 33 is fed to cut into the workpiece 1 from one end in the second direction B (left end as viewed in FIG. 12) along all of the second division lines 3B to a central position of the workpiece 1 (cut end) as shown by the broken line arrows, wherein the workpiece 1 is fully cut in the direction along the thickness thereof, thereby forming first division grooves 3*e* along the second division lines 3B as shown in an enlarged view as a lower part of FIG. 12 (first division groove forming step). In this enlarged view, reference symbols 3*a* denote the division grooves extending in the first direction A as formed in the first cutting step.

Figure 13:
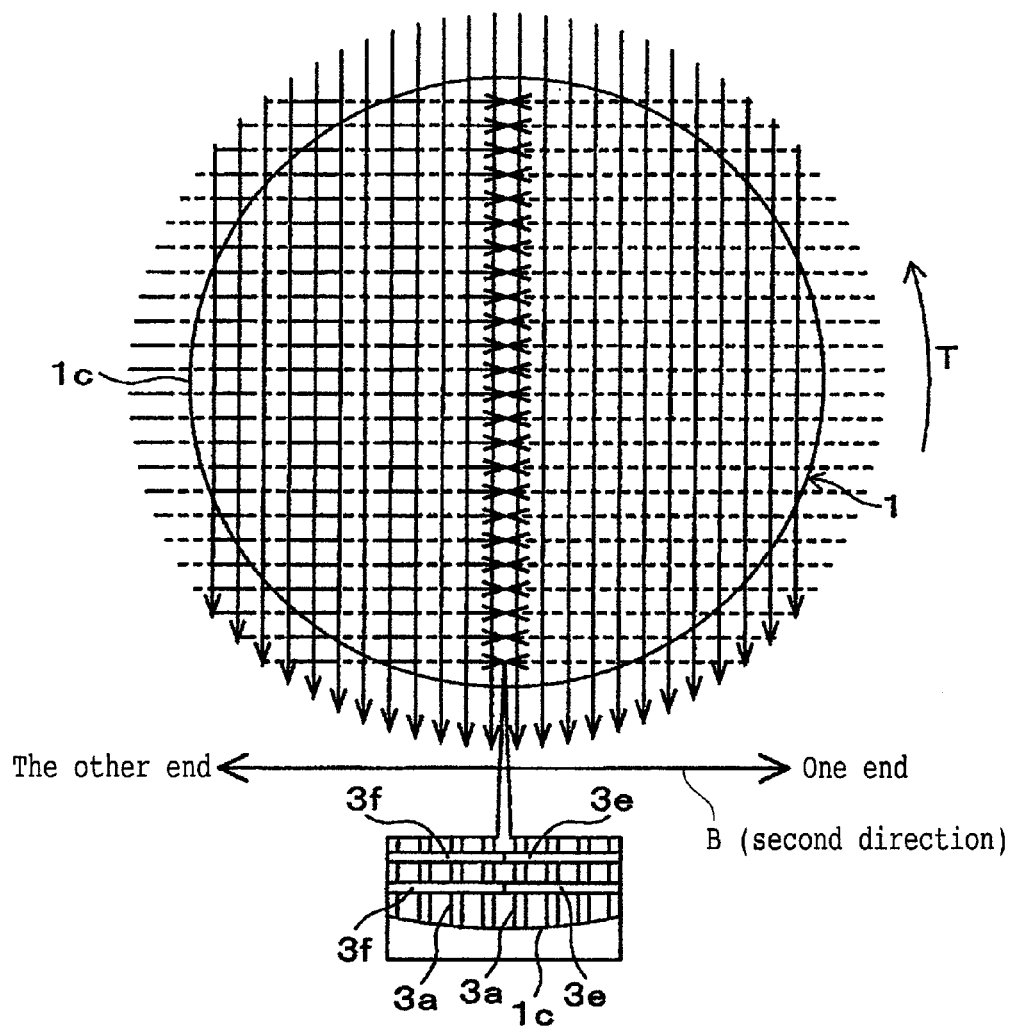
FIG. 13 is a plan view of the workpiece, showing a second division groove forming step in the second cutting step according to the third preferred embodiment.

Thereafter, as shown in FIG. 13, the holding table 20 is rotated 180 degrees in the direction shown by an arrow T from the condition shown in FIG. 12 to change the other end in the second direction B to the left end as viewed in FIG. 13 and make the second direction B parallel to the feeding direction. In this condition, the cutting blade 33 is fed to cut into the workpiece 1 from the other end in the second direction B (left end as viewed in FIG. 13) along all of the second division lines 3B to the central position of the workpiece 1 (cut end) as shown by the dot and dash line arrows, wherein the workpiece 1 is fully cut in the direction along the thickness thereof, thereby forming second division grooves 3*f* respectively connected with the first division grooves 3*e* along the second division lines 3B as shown in an enlarged view as a lower part of FIG. 13 (second division groove forming step). Thusly, the second cutting step is finished to form the division grooves (the first and second division grooves 3e and 3f) along all of the second division lines 3B on the workpiece 1. As a result, all of the rectangular devices 2 are divided into individual chips.

According to the third preferred embodiment, the cutting blade 33 is fed to cut into the workpiece 1 from one end and the other end in the second direction B to the central position of the workpiece 1 in performing the second cutting step. Accordingly, waste chips are formed at the time the cutting blade 33 starts cutting the workpiece 1 at one end and the other end in the second direction B, and the cutting blade 33 is relatively fed to the central position of the workpiece 1. Accordingly, even when chip scattering occurs due to the flow of the cutting fluid in forming the waste chips, the waste chips scatter to the outside of the workpiece 1 and there is no possibility that the waste chips may fall onto the upper surface of the workpiece 1. As a result, it is possible to prevent the scratch on the upper surface of the workpiece 1 due to the chip scattering.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A dividing method for a disk-shaped workpiece on which a plurality of first division lines extending in a first direction and a plurality of second division lines intersecting the first division lines and extending in a second direction are set to define a plurality of chips, said disk-shaped workpiece having a chip region where said chips are formed and a peripheral marginal region surrounding said chip region, said dividing method comprising:
   a first cutting step of fully cutting said workpiece in a thickness direction thereof along said first division lines by using a cutting blade; and
   a second cutting step of fully cutting said workpiece in said thickness direction along said second division lines by using said cutting blade after performing said first cutting step;
   wherein the direction of rotation of said cutting blade is set so that said cutting blade cuts said workpiece from an upper surface thereof to a lower surface thereof, and a cutting fluid is supplied to said cutting blade in performing said first cutting step and said second cutting step, and
   in at least said second cutting step, said cutting blade is fed to cut into said workpiece from an outside edge of an outer circumference thereof in said second direction toward an end where the outer circumference of said workpiece is not cut to form an uncut region.

2. A dividing method for a disk-shaped workpiece on which a plurality of first division lines extending in a first direction and a plurality of second division lines intersecting the first division lines and extending in a second direction are set to define a plurality of chips, said disk-shaped workpiece having a chip region where said chips are formed and a peripheral marginal region surrounding said chip region, said dividing method comprising:
   a first cutting step of fully cutting said workpiece in a thickness direction thereof along said first division lines by using a cutting blade; and
   a second cutting step of fully cutting said workpiece in said thickness direction along said second division lines by using said cutting blade after performing said first cutting step;
   wherein the direction of rotation of said cutting blade is set so that said cutting blade cuts said workpiece from an upper surface thereof to a lower surface thereof, and a cutting fluid is supplied to said cutting blade in performing said first cutting step and said second cutting step,
   wherein
   said first cutting step includes:
   a first sub-step of feeding said cutting blade to cut into said workpiece from a first end in said first direction toward a second end in said first direction for a substantially half number of said first division lines counted from a third end in said second direction to a substantially central position of said workpiece, thereby forming division grooves along said first division lines in a condition where an outer circumference of said workpiece near the second end in said first direction is not cut to form a first uncut region; and
   a second sub-step of feeding said cutting blade to cut into said workpiece from the second end in said first direction toward the first end in said first direction for a remaining half number of said first division lines counted from a fourth end in said second direction to the substantially central position of said workpiece, thereby forming division grooves along said first division lines in a condition where the outer circumference of said workpiece near the first end in said first direction is not cut to form a second uncut region, and
   said second cutting step includes:
   a first sub-step of feeding said cutting blade to cut into said workpiece from the third end in said second direction toward the fourth end in said second direction for the substantially half number of said second division lines counted from the first end in said first direction to the substantially central position of said workpiece, thereby forming division grooves along said second division lines in a condition where the outer circumference of said workpiece near the fourth end in said second direction is not cut to form the second uncut region; and
   a second sub-step of forming said cutting blade to cut into said workpiece from the fourth end in said second direction toward the third end in said second direction for the remaining half number of said second division lines counted from the fourth end in said first direction to the substantially central position of said workpiece, thereby forming division grooves along said second division lines in a condition where the outer circumference of said workpiece near the third end in said second direction is not cut to form the first uncut region.

3. The dividing method according to claim 1, wherein said second cutting step comprises:
   a first division groove forming step of feeding said cutting blade to cut into said workpiece from one end in said second direction along said second division lines to a central position of said workpiece, thereby forming first division grooves along said second division lines; and
   a second division groove forming step of feeding said cutting blade to cut into said workpiece from the other end in said second direction along said second division lines to the central position of said workpiece, thereby forming second division grooves respectively connected with said first division grooves along said second division lines.

* * * * *